US012796212B2

(12) United States Patent
Hua et al.

(10) Patent No.: US 12,796,212 B2
(45) Date of Patent: Nov. 10, 2026

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Zhengshen Hua, Wuhan (CN); Mugyeom Kim, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 426 days.

(21) Appl. No.: 18/558,182

(22) PCT Filed: Jun. 29, 2023

(86) PCT No.: PCT/CN2023/104227
§ 371 (c)(1),
(2) Date: Oct. 30, 2023

(87) PCT Pub. No.: WO2024/124868
PCT Pub. Date: Jun. 20, 2024

(65) Prior Publication Data

US 2025/0113702 A1    Apr. 3, 2025

(30) Foreign Application Priority Data

Dec. 13, 2022 (CN) ......................... 202211601363.1

(51) Int. Cl.
*H10K 50/155* (2023.01)
*H10K 50/13* (2023.01)
(Continued)

(52) U.S. Cl.
CPC ........... *H10K 50/155* (2023.02); *H10K 50/13* (2023.02); *H10K 50/165* (2023.02); *H10K 50/19* (2023.02)

(58) Field of Classification Search
CPC .... H10K 50/155; H10K 50/13; H10K 50/165; H10K 50/19; H10K 2101/80;
(Continued)

(56) References Cited

U.S. PATENT DOCUMENTS

2018/0114939 A1 4/2018 Oh et al.
2018/0159084 A1* 6/2018 Ma ......................... H10K 71/30

FOREIGN PATENT DOCUMENTS

CN 103794730 A 5/2014
CN 107611271 A 1/2018
(Continued)

OTHER PUBLICATIONS

Chinese Office Action issued in corresponding Chinese Patent Application No. 202211601363.1 dated May 23, 2025, pp. 1-12.
(Continued)

*Primary Examiner* — Jonathan Han
(74) *Attorney, Agent, or Firm* — PV IP PC; Christopher S. Ruprecht; Wei Te Chung

(57) ABSTRACT

Embodiments of the present disclosure disclose a display panel and a mobile terminal. The display panel includes a light-emitting layer. The light-emitting layer includes a first electrode, a hole injection layer, a first light-emitting unit layer, an electron-generating layer, a hole-generating layer, a second light-emitting unit layer, and a second electrode stacked in sequence. By adopting the technical solutions of the present disclosure, the light-emitting device of the display panel can operate at high temperatures or low temperatures with high current efficiency without changing the structure of the light-emitting layer.

20 Claims, 4 Drawing Sheets

(51) Int. Cl.
*H10K 50/165* (2023.01)
*H10K 50/19* (2023.01)

(58) Field of Classification Search
CPC ........ H10K 50/00; H10K 77/10; H10K 50/17; H10K 59/12; H10K 59/80; H10K 59/8051; H10K 59/8052; G09F 9/33
See application file for complete search history.

(56) References Cited

FOREIGN PATENT DOCUMENTS

| | | | | | | |
|---|---|---|---|---|---|---|
| CN | 115064646 | A | | 9/2022 | | |
| CN | 115117137 | A | | 9/2022 | | |
| CN | 115207239 | A | | 10/2022 | | |
| CN | 115802787 | A | | 3/2023 | | |
| KR | 20130025115 | A | * | 3/2013 | ............. | H10K 71/30 |
| KR | 20130057738 | A | * | 6/2013 | ............. | H10K 50/19 |
| KR | 20180009522 | A | | 1/2018 | | |
| KR | 20180044466 | A | | 5/2018 | | |

OTHER PUBLICATIONS

Rejection Decision issued in corresponding Korean Patent Application No. 10-2023-7041184 dated Jun. 24, 2025, pp. 1-4.
International Search Report in International application No. PCT/CN2023/104227, mailed on Oct. 20, 2023.
Written Opinion of the International Search Authority in International application No. PCT/CN2023/104227, mailed on Oct. 20, 2023.
Korean Office Action issued in corresponding Korean Patent Application No. 10-2023-7041184 dated Oct. 22, 2024, pp. 1-9.

* cited by examiner

DISPLAY PANEL AND MOBILE TERMINAL

TECHNICAL FIELD

The present disclosure relates to the field of display, and in particularly, to a display panel and a mobile terminal.

BACKGROUND

The OLED technology has been widely used in the display industry. For example, in recent years, it has been increasingly widely used in various fields, such as car monitors, computer displays, TV screens, mobile phone screens, commercial display and the like, and have broad application prospects.

With the development of display technology, the requirements for life of display are gradually increasing. It is difficult for traditional single-layer RGB to meet the requirements of high brightness and long life. In order to meet the high performance requirements of high brightness and long life, stacked RGB or W devices with more complex structures are generally used, which can realize light-emitting efficiency several times that of single-layer devices, but the process is difficult. In addition, at high-temperatures, the stacked light-emitting devices have the risks of high driving voltage, low efficiency and low life. The specific reason is that when working at high temperatures or low temperatures, the interface between the electron-generating layer (n-CGL) and the hole-generating layer (p-CGL) is easy to form defects, which is not conducive to the generation and separation of charges, resulting in the increase of device voltage, the imbalance of charges, the decline of light-emitting efficiency and the decline of life stability.

SUMMARY

Embodiments of the present disclosure provides a display panel and a mobile terminal, which make it possible to operate a light-emitting device of the display panel at a high temperature or a low temperature with high current efficiency, high service life stability, long service life, and low driving voltage without changing the structure of the light-emitting layer.

To realize the above functions, the technical solutions provided in the embodiments of the present disclosure are as follows:

Embodiments of the present disclosure provides a display panel, which includes:

a substrate layer;

a light-emitting layer including a first electrode, a hole injection layer, a first light-emitting unit layer, an electron-generating layer, a hole-generating layer, a second light-emitting unit layer, and a second-electrode stacked in sequence, the first electrode is disposed on the substrate layer, the electron-generating layer includes n-type dopants, and the hole-generating layer includes p-type dopants;

wherein a first direction is perpendicular to the substrate layer and extends from the substrate layer to the light-emitting layer, and in the first direction, the n-type dopants in the electron-generating layer has a plurality of doping concentrations, and the plurality of doping concentrations of the n-type dopants in the electron-generating layer tend to decrease in the first direction; and/or the p-type dopants in the hole-generating layer has a plurality of doping concentrations, and the plurality of doping concentrations of the p-type dopants in the hole-generating layer tend to increase in the first direction.

Optionally, in a case that the plurality of doping concentrations of the n-type dopants in the electron-generating layer tend to decrease in the first direction, the plurality of doping concentrations of the n-type dopants in the electron-generating layer gradually decrease in the first direction; and in a case that the plurality of doping concentrations of the p-type dopants in the hole-generating layer tend to increase in the first direction, the plurality of doping concentrations of the p-type dopants in the hole-generating layer gradually increase in the first direction.

Optionally, a rate of change of the plurality of doping concentrations of the n-type dopants in the electron-generating layer gradually decrease in the first direction; and a rate of change of the plurality of doping concentrations of the p-type dopants in the hole-generating layer gradually increase in the first direction.

Optionally, an absolute value of the rate of change of the plurality of doping concentrations of the n-type dopants in the electron-generating layer is the same as an absolute value of the rate of change of the plurality of doping concentrations of the p-type dopants in the hole-generating layer.

Optionally, ach of the plurality of doping concentrations of the n-type dopants ranges from a first concentration to a second concentration, and a difference between the first concentration and the second concentration ranges from 1 wt % to 19 wt %; and each of the plurality of doping concentrations of the p-type dopants ranges from a third concentration to a fourth concentration, and a difference between the third concentration and the fourth concentration ranges from 1 wt % to 19 wt %.

Optionally, the first concentration ranges from 6 wt % to 20 wt %, and the second concentration ranges from 1 wt % to 5 wt %; and the third concentration ranges from 1 wt % to 5 wt %, and the fourth concentration ranges from 6 wt % to 20 wt %.

Optionally, the electron-generating layer consists of X layers of electron-generating sub-layers stacked in the first direction, a concentration of n-type dopants in a first electron-generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$; and wherein X is a positive integer greater than or equal to 2, and $N_1>N_2>N_3> \ldots >N_{X-1}>N_X$.

Optionally, the hole generating layer consists of Y layers of hole-generating sub-layers stacked in the first direction, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$; and wherein Y is a positive integer greater than or equal to 2, and $M_1<M_2<M_3< \ldots <M_{Y-1}<M_Y$.

Optionally, the electron-generating layer includes a first electron-generating sub-layer, a second electron-generating sub-layer, and a third electron-generating sub-layer stacked in the first direction, and the hole-generating layer includes a first hole-generating sub-layer, a second hole-generating sub-layer, and a third hole-generating sub-layer stacked in the first direction; and wherein a concentration of n-type dopants in the first electron-generating sub-layer is the same as a concentration of p-type dopants in the third hole-generating sub-layer, a concentration of n-type dopants in the second electron-generating sub-layer is the same as a concentration of p-type dopants in the second hole-generating sub-layer, and a concentration of n-type dopants in the third electron-generating sub-layer is the same as a concentration of p-type dopants in the first hole-generating sub-layer.

Optionally, in the light-emitting layer, an intermediate layer is disposed between the electron-generating layer and the hole-generating layer, and a material of the intermediate layer has a property of transporting electrons.

Optionally, the material of the intermediate layer includes at least one of metal compounds, alkaline metals, and inorganic compounds.

The present disclosure further provides a mobile terminal including a display panel, wherein the display panel includes:

a substrate layer;

a light-emitting layer including a first electrode, a hole injection layer, a first light-emitting unit layer, an electron-generating layer, a hole-generating layer, a second light-emitting unit layer, and a second electrode stacked in sequence, the first electrode is disposed on the substrate layer, the electron-generating layer includes n-type dopants, and the hole-generating layer includes p-type dopants;

wherein a first direction is perpendicular to the substrate layer and extends from the substrate layer to the light-emitting layer, and in the first direction, the n-type dopants in the electron-generating layer has a plurality of doping concentrations, and the plurality of doping concentrations of the n-type dopants in the electron-generating layer tend to decrease in the first direction; and/or the p-type dopants in the hole-generating layer has a plurality of doping concentrations, and the plurality of doping concentrations of the p-type dopants in the hole-generating layer tend to increase in the first direction Optionally, in a case that the plurality of doping concentrations of the n-type dopants in the electron-generating layer tend to decrease in the first direction, the plurality of doping concentrations of the n-type dopants in the electron-generating layer gradually decrease in the first direction; and in a case that the plurality of doping concentrations of the p-type dopants in the hole-generating layer tend to increase in the first direction, the plurality of doping concentrations of the p-type dopants in the hole-generating layer gradually increase in the first direction.

Optionally, a rate of change of the plurality of doping concentrations of the n-type dopants in the electron-generating layer gradually decrease in the first direction; and a rate of change of the plurality of doping concentrations of the p-type dopants in the hole-generating layer gradually increase in the first direction.

Optionally, an absolute value of the rate of change of the plurality of doping concentrations of the n-type dopants in the electron-generating layer is the same as an absolute value of the rate of change of the plurality of doping concentrations of the p-type dopants in the hole-generating layer.

Optionally, each of the plurality of doping concentrations of the n-type dopants ranges from a first concentration to a second concentration, and a difference between the first concentration and the second concentration ranges from 1 wt % to 19 wt %; and each of the plurality of doping concentrations of the p-type dopants ranges from a third concentration to a fourth concentration, and a difference between the third concentration and the fourth concentration ranges from 1 wt % to 19 wt %.

Optionally, the first concentration ranges from 6 wt % to 20 wt %, and the second concentration ranges from 1 wt % to 5 wt %; and the third concentration ranges from 1 wt % to 5 wt %, and the fourth concentration ranges from 6 wt % to 20 wt %.

Optionally, the electron-generating layer consists of X layers of electron-generating sub-layers stacked in the first direction, a concentration of n-type dopants in a first electron generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$; and wherein X is a positive integer greater than or equal to 2, and $N_1>N_2>N_3> \ldots >N_{X-1}>N_X$.

Optionally, the hole-generating layer consists of Y layers of hole-generating sub-layers stacked in the first direction, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$; and wherein Y is a positive integer greater than or equal to 2, and $M_1<M_2<M_3< \ldots <M_{Y-1}<M_Y$.

Optionally, the electron-generating layer includes a first electron-generating sub-layer, a second electron-generating sub-layer, and a third electron-generating sub-layer stacked in the first direction, and the hole-generating layer includes a first hole-generating sub-layer, a second hole-generating sub-layer, and a third hole-generating sub-layer stacked in the first direction; and wherein a concentration of n-type dopants in the first electron-generating sub-layer is the same as a concentration of p-type dopants in the third hole-generating sub-layer, a concentration of n-type dopants in the second electron-generating sub-layer is the same as a concentration of p-type dopants in the second hole-generating sub-layer, and a concentration of n-type dopants in the third electron-generating sub-layer is the same as a concentration of p-type dopants in the first hole-generating sub-layer.

Advantageous Effects

In the present disclosure, the light-emitting layer of the display panel includes a first electrode, a hole injection layer, a first light-emitting unit layer, an electron-generating layer, a hole-generating layer, a second light-emitting unit layer, and a second electrode that are stacked in sequence. The electron-generating layer includes n-type dopants. The hole-generating layer includes p-type dopants. In the first direction, the doping concentrations of the n-type dopants in the electron-generating layer are different at different thicknesses in the electron-generating layer, and the doping concentrations of the n-type dopants in the first direction tend to decrease with the increase of the thickness of the electron-generating layer; and/or the doping concentrations of the p-type dopants in the hole-generating layer are different at different thicknesses in the hole-generating layer, and the doping concentrations of the p-type dopants in the first direction tend to increase with the increase of the thickness of the hole-generating layer. By adopting the method of variable concentration doping, it is not easy to form a space charge region at the interface between the N-doped electron-generating layer and the P-doped hole-generating layer, or the charge is relatively stable after the space charge region is formed, so as to prevent the occurrence of interface reaction, so that the light-emitting device has a long service life, high life stability and low driving voltage even at high temperatures or low temperatures, which can meet the requirements of using the product in a harsh environment.

BRIEF DESCRIPTION OF THE DRAWINGS

The technical solutions and other beneficial effects of the present disclosure will be apparent from the detailed description of specific embodiments of the present disclosure with reference to the accompanying drawings.

EMBODIMENTS OF THE INVENTION

Figure 1:
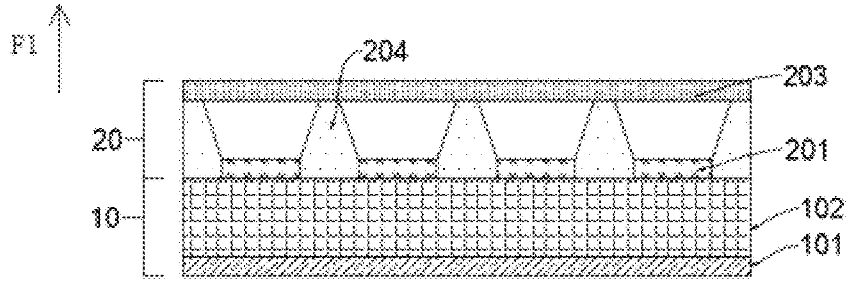
FIG. 1 is schematic structural diagram of a display panel according to embodiments of the present disclosure.

Hereinafter, technical solution in embodiments of the present disclosure will be clearly and completely described with reference to the accompanying drawings in embodiments of the present disclosure. Obviously, the described embodiments are part of, but not all of, the embodiments of the present disclosure. All the other embodiments, obtained by a person with ordinary skill in the art on the basis of the embodiments in the present disclosure without expenditure of creative labor, belong to the protection scope of the present disclosure.

Embodiments of the present disclosure provide a display panel and a mobile terminal. Detailed descriptions are given below. It should be noted that the order in which the following examples are described is not intended to limit the preferred order of the examples. Additionally, in the description herein, the term “including” means “including, but not limited to”. Terms such as “first”, “second”, “third” are merely used for the purpose of description and do not impose numerical requirements or establish an order. Various embodiments of the present disclosure may be presented in a range format. It should be understood that the description in range format is merely for convenience and brevity and should not be construed as an inflexible limitation on the scope of the present disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range. In addition, whenever a numerical range is indicated herein, it is meant to include any cited numeral (fractional or integral) within the indicated range.

Embodiments of the present disclosure provide a display panel and a mobile terminal. Detailed descriptions are given below. It should be noted that the order in which the following examples are described is not intended to limit the preferred order of the examples. Additionally, in the description herein, the term “including” means “including, but not limited to”. Terms such as “first”, “second”, “third” are merely used for the purpose of description and do not impose numerical requirements or establish an order. Various embodiments of the present disclosure may be presented in a range format. It should be understood that the description in range format is merely for convenience and brevity and should not be construed as an inflexible limitation on the scope of the present disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range. In addition, whenever a numerical range is indicated herein, it is meant to include any cited numeral (fractional or integral) within the indicated range.

Currently, the disadvantages of OLED technology are mainly reflected in efficiency and life characteristics. Computer monitors have very high requirements on service life. A conventional single-layer RGB light-emitting device structure is difficult to meet the higher requirements of high brightness and long service life. The structure of stacked RGB light-emitting device or W device is relatively complex and the process difficulty is high, but it can achieve high performance requirements of high brightness and long service life, and can also achieve luminous efficiency several times that of single-layer devices. However, at high temperature, stacked devices have the risks of high driving voltage, low efficiency and short service life. Exemplarily, when working in high temperature or low temperature environments, the interface between n-CGL and p-CGL in the charge-generating layer 2023 is easy to form defects, which is not conducive to the generation and separation of charges, resulting in the increase of device voltage, the imbalance of charges, the decline of light-emitting efficiency and the decline of life stability. In order to solve the above technical problems, the present disclosure provides the following technical solutions, see FIG. 1 to FIG. 10 for details.

As shown in FIGS. 1 to 10, embodiments of the present disclosure provide a display panel including:

a substrate layer 10;

a light-emitting layer 20 including a first electrode, a hole injection layer 2021, a first light-emitting unit layer 2022, an electron-generating layer 20231, a hole-generating layer 20232, a second light-emitting unit layer 2024, and a second electrode that are sequentially stacked in a first direction F1, the first electrode being disposed on the substrate layer 10, the first direction F1 being perpendicular to the substrate layer 10 and extending from the substrate layer 10 to the light-emitting layer 20, the electron-generating layer 20231 including n-type dopants, and the hole-generating layer 20232 including p-type dopants;

in the first direction F1, the n-type dopants in the electron-generating layer 20231 has a plurality of doping concentrations, and the plurality of doping concentrations of the n-type dopants in the electron-generating layer 20231 tend to decrease in the first direction F1; and/or the p-type dopants in the hole-generating layer 20232 has a plurality of doping concentrations, and the plurality of doping concentrations of the p-type dopants in the hole-generating layer 20232 tend to increase in the first direction F1.

Exemplarily, as shown in FIG. 1, the substrate layer 10 may include an array substrate. The array substrate includes a base 101 and a driving device layer 102 disposed on the base 101. The driving device layer 102 includes a plurality of driving devices disposed in an array, and the plurality of driving devices are used for controlling light-emitting devices on the light-emitting layer 20 to emit light. The substrate layer 10 may also be a flat layer on the array substrate closest to the light-emitting layer 20.

Exemplarily, the driving device on the array substrate may be a thin film transistor.

Figure 2A:
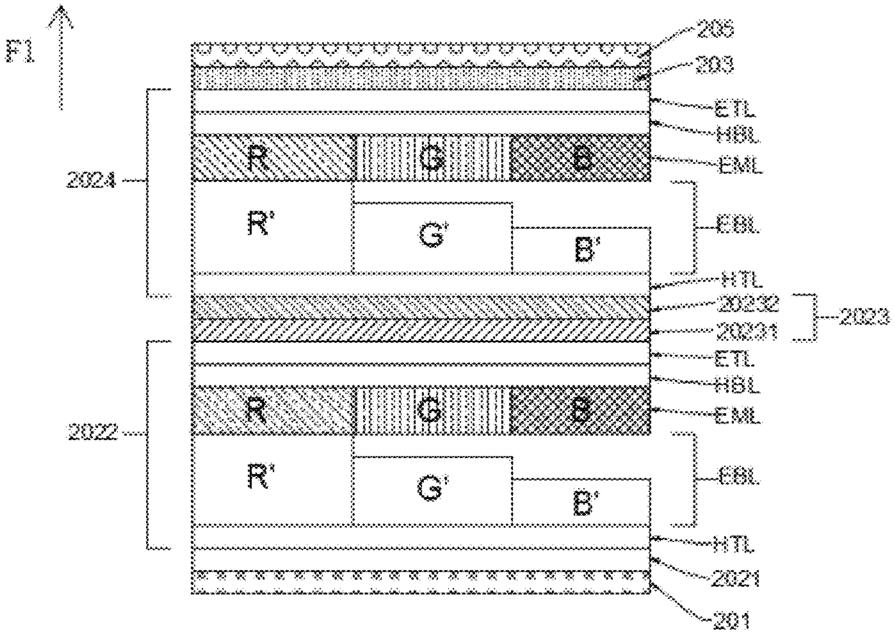
FIG. 2*a* is a schematic structural diagram of a light-emitting device according to embodiments of the present disclosure.

Exemplarily, as shown in FIG. 1 and FIG. 2*a*, the light-emitting layer 20 further includes pixel definition layers 204 on which a plurality of pixel openings are disposed, each of the pixel openings corresponds to one light-emitting device. The light-emitting device includes a first electrode, a hole injection layer 2021, a first light-emitting unit layer 2022, an electron-generating layer 20231, a hole-generating layer 20232, a second light-emitting unit layer 2024, and a second electrode that are stacked sequentially in a first direction F1. The first direction F1 is perpendicular to the substrate layer 10. The electron-generating layer 20231 includes n-type dopants, and the hole-generating layer 20232 includes p-type dopants.

Exemplarily, the first electrode is an anode 201. The material of the anode 201 includes but is not limited to any one of Ag, ITO, ITO/Ag/ITO, IZO, and the like. The thickness of the anode 201 may range from 80 nm to 150 nm.

The second electrode is a cathode 203. The material of the cathode 203 includes but is not limited to, alloys such as Mg—Ag, Ag, Al, and Al—Ca. The thickness of the cathode 203 may range from 10 nm to 90 nm.

The first electrode of the light-emitting device is connected with the driving device, so that the driving device drives the light-emitting device to emit light for display, wherein the first direction F1 is perpendicular to the substrate layer 10 and extends from the substrate layer 10 to the direction of the light-emitting layer 20.

Exemplarily, the hole injection layer 2021 in this embodiment is a p-doped hole injection layer (p-HIL), which may have a thickness of 80 nm to 150 nm. P-HIL may be a p-doped MeO (metal oxide)-TPD (N,N-bis(3-methylphenyl)-N,N'-diphenyl-1,1'-diphenyl-4,4'-diamine):F4TCNQ (2,3,5,6-tetrafluoro-7,7',8,8'-tetracyanodimethyl-p-benzoquinone) or m-MTDATA:F4TCNQ (4,4',4"-tris(N-3-methylphenyl-N-phenylamino)triphenylamine: 2,3,5,6-tetrafluoro-7,7',8,8'-tetracyanodimethyl-p-benzoquinone), and the like.

Exemplarily, the film layer structures of the first light-emitting unit layer 2022 and the second light-emitting unit layer 2024 may be the same. The structure of the first light-emitting unit layer 2022 may include a hole-transporting layer HTL disposed on the p-HIL, an electron-blocking layer EBL disposed on the hole-transporting layer HTL, an organic light-emitting layer EML disposed on the electron-blocking layer EBL, a hole-blocking layer HBL disposed on the organic light-emitting layer (EML), and an electron-transporting layer ETL disposed on the hole-blocking layer HBL. The thickness of the EML may range from 15 nm to 50 nm. The thickness of the HBL may range from 2 nm to 8 nm. The thickness of the ETL may range from 20 nm to 45 nm.

The organic light-emitting layer EML includes a blue light-emitting layer (B-EML), a red light-emitting layer (R-EML), and a green light-emitting layer (G-EML). The material of the B-EML may be a fluorescent material, a TADF material, a superfluorescent material, or the like, such as DSA-ph. The red light-emitting layer (R-EML) and the green light-emitting layer (G-EML) may adopt a single host-dopant phosphorescent material or a pre-mix host-dopant material.

The fluorescent material may include a metal-organic complex, such as $Alq_3$, $Gaq_3$, Al (Saph-q) or Ga (Saph-q), and the small molecular material can be doped with dyes.

The material of the organic light-emitting layer may also a carbazole derivative such as 4,4'-N,N'-dicarbazole-biphenyl (CBP), polyvinylcarbazole (PVK), this material may be doped with phosphorescent dyes such as tris(2-phenylpyridine)iridium($Ir(ppy)_3$), bis(2-phenylpyridine)(acetylacetone)iridium($Ir(ppy)_2(acac)$), octaethylporphyrin platinum (PtOEP), and the like.

The host material of the light-emitting unit layer is preferably HAT or 4,4',4"-tris(N-3-methylphenyl-N-phenyl-amino)-triphenylamine (m-MTDATA), 4,4',4"-tris(N-2-naphthyl-N-phenyl-amino)-triphenylamine (2-TNATA).

The electron-blocking layer EBL may also be referred to as a compensation layer. The electron-blocking layer EBL includes a B'-EBL corresponding to B-EML, a R'-EBL corresponding to R-EML, and a G'-EBL corresponding to G-EML. The thickness of the EBL may range from 3 nm to 100 nm. The EBL has different thickness values corresponding to different colors of organic light-emitting layers, the thickness of R'-EBL is greater than that of G'-EBL, and the thickness of G'-EBL is greater than that of B'-EBL.

The material of the electron-blocking layer EBL may be a material with hole transport and electron-blocking effects, and is not limited to one or more materials, such as any one of an alkali metal-doped 1,1-bis [4-[N,N'-bis(p-tolyl)amino] phenyl]cyclohexane (TAPC), N,N'-bis(3-methylphenyl)-N, N'-diphenyl-4,4'-biphenyldiamine (TPD), 4,4',4"-tris(carbazol-9-yl)triphenylamine (TCTA), N,N'-(1-naphthyl)-N,N'-diphenyl-4,4'-biphenyldiamine (NPB), 1,3,5-triphenylbenzene (TDAPB), or copper phthalocyanine (CuPc).

The material of the hole-blocking layer HBL may be a material with hole-blocking and electron transport effects, and is not limited to one or more materials, such as any one of 2-(4-biphenyl)-5-(4-tert-butyl)phenyl-1,3,4-oxadiazole (PBD), 8-hydroxyquinoline aluminum (Alq3), 2,5-di(1-naphthyl)-1,3,4-oxadiazole (BND), 4,7-diphenyl-1,10-phenanthroline (Bphen), 1,2,4-triazole derivative (such as TAZ), N-arylbenzimidazole (TOBI), or quinoxaline derivative (TPQ).

The material of the electron transport layer ETL may be an electron transport material or a doping material of an electron transport material and a n-type dopant (the n-type dopant includes but is not limited to a metal such as Mg, Yb, Li, Cs, or a metal compound such as $CS_2CO_3$, LiH, or $LiNH_3$), and is not limited to one or more materials such as 4,7-diphenyl-1,10-phenanthroline doped with $CS_2CO_3$.

The display panel further includes a light extraction layer 205 (CPL) disposed on one side of the second electrode away from the substrate layer 10. The material of the light extraction layer 205 includes an organic transparent insulating material, and high refractive index particles are doped in the light extraction layer 205.

The organic transparent insulating material may be an organic polymer, such as resin. The high refractive index particles may be one or a combination of at least two of titanium oxide, silicon oxide, magnesium oxide, zirconium oxide, zinc sulfide, titanium oxide, aluminum oxide, zinc oxide, silicon nitride. The high refractive index particles account for 10 wt % to 30 wt % of the organic polymer.

Exemplarily, an electron-generating layer 20231 and a hole-generating layer 20232 including a p-type dopant are disposed between the first light-emitting unit layer 2022 and the second light-emitting unit layer 2024. The electron-generating layer 20231 includes n-type dopants. The hole-generating layer 20232 includes p-type dopants. The thickness of the electron-generating layer 20231 ranges from 4 nm to 25 nm. The thickness of the hole-generating layer 20232 ranges from 3 nm to 15 nm.

Further, the material of the electron-generating layer 20231 may be a complex of an electron transport material doped with a metal, for example, $Bebq_2$:K.

Exemplarily, the n-type dopant includes at least one of an alkali metal, an alkaline earth metal, a rare earth metal, and a metal compound of the above metal.

Further, the n-type dopant includes at least one of lithium (Li), sodium (Na), potassium (K), rubidium (Rb), cesium (Cs), francium (Fr), beryllium (Be), magnesium (Mg), calcium (Ca), silicon (Si), barium (Ba), radium (Ra), lanthanum (La), cerium (Ce), praseodymium (Pr), neodymium (Nd), samarium (Sm), europium (Eu), terbium (Tb), thorium (Th), dysprosium (Dy), holmium (Ho), erbium (Er), gadolinium (Gd), ytterbium (Yb), lutetium (Lu), yttrium (Y), manganese (Mn), and a metal compound of the above metals.

The material of the hole-generating layer 20232 may be a p-type doped HTL material, such as WOx, MoOx, $FeCl_2$, HAT, MATADA doped $F_4TCNQ$ or NPB doped $F_4TCNQ$.

It should be noted that the structure of stacked RGB light-emitting device or W device can achieve high performance requirements of high brightness and long service life, and can also achieve luminous efficiency several times that of single-layer devices. However, at high temperature, stacked devices have the risks of high driving voltage, low efficiency and short service life. It is mainly reflected in the fact that when working in high temperature or low temperature environments, the interface between n-CGL and p-CGL is easy to form defects, which is not conducive to the generation and separation of charges, resulting in the increase of device voltage, the imbalance of charges, the decline of light-emitting efficiency and the decline of life stability.

In order to solve the above problems, in the first direction F1, the n-type dopants in the electron-generating layer 20231 disposed in this embodiment has a plurality of doping concentrations, and the doping concentrations of the n-type dopants tend to decrease as the thickness of the electron-generating layer 20231 increases (in the first direction); and/or the p-type dopants in the hole-generating layer 20232 has a plurality of doping concentrations, and the doping concentrations of the p-type dopants tend to increase as the thickness of the hole-generating layer 20232 increases (in the first direction F1).

It can be a case that only the doping concentrations of the n-type dopants in the electron-generating layer 20231 are set in a variable concentration manner, or a case that only the doping concentrations of the p-type dopants in the hole-generating layer 20232 are set in a variable concentration manner, or both the doping concentrations of the n-type dopants in the electron-generating layer 20231 and the doping concentrations of the p-type dopants in the hole-generating layer 20232 are set in a variable concentration manner.

The electron-generating layer 20231 and the hole-generating layer 20232 are provided by adopting the above variable doping concentration manner, so that it is not easy to form a space charge region at the interface between the N-doped electron-generating layer 20231 and the P-doped hole-generating layer 20232, or the charge is relatively stable after the space charge region is formed, so as to prevent the occurrence of interface reaction, so that the light-emitting device has a long life, high life stability and low driving voltage even at high temperatures or low temperatures, and meets the requirements of products used in harsh environments.

It can be understood that in this embodiment, the light-emitting layer 20 of the display panel includes a first electrode, a hole injection layer 2021, a first light-emitting unit layer 2022, an electron-generating layer 20231, a hole-generating layer 20232, a second light-emitting unit layer 2024, and a second electrode that are stacked in sequence. The electron-generating layer 20231 includes n-type dopants. The hole-generating layer 20232 includes p-type dopants. In the first direction F1, the doping concentrations of the n-type dopants in the electron-generating layer 20231 are different at different thicknesses in the electron-generating layer 20231, and the doping concentrations of the n-type dopants tend to decrease with the increase of the thickness of the electron-generating layer 20231 (in the first direction F1); and/or the doping concentrations of the p-type dopants in the hole-generating layer 20232 are different at different thicknesses in the hole-generating layer 20232, and the doping concentrations of the p-type dopants tend to increase with the increase of the thickness of the hole-generating layer 20232 (in the first direction F1). By adopting the method of variable concentration doping, it is not easy to form a space charge region at the interface between the N-doped electron-generating layer 20231 and the P-doped hole-generating layer 20232, or the charge is relatively stable after the space charge region is formed, so as to prevent the occurrence of interface reaction, so that defects of the interface in the charge-generating layer 2023 (CGL) are reduced, thereby effectively improving the ability of the charge-generating 2023 (the electron-generating layer 20231 and the hole-generating layer 20232) to generate charges and to separate charges, making the driving voltage at the time of operation, so that the light-emitting device has a long service life, high stability, low driving voltage, and high stability even at a high temperature or a low temperature, which can meet the requirements of using the product in a harsh environment.

Following the above embodiment, the doping concentration of the n-type dopants in the electron-generating layer 20231 gradually decreases in the first direction F1, and the doping concentration of the p-type dopants in the hole-generating layer 20232 gradually increases in the first direction F1.

Figure 3:
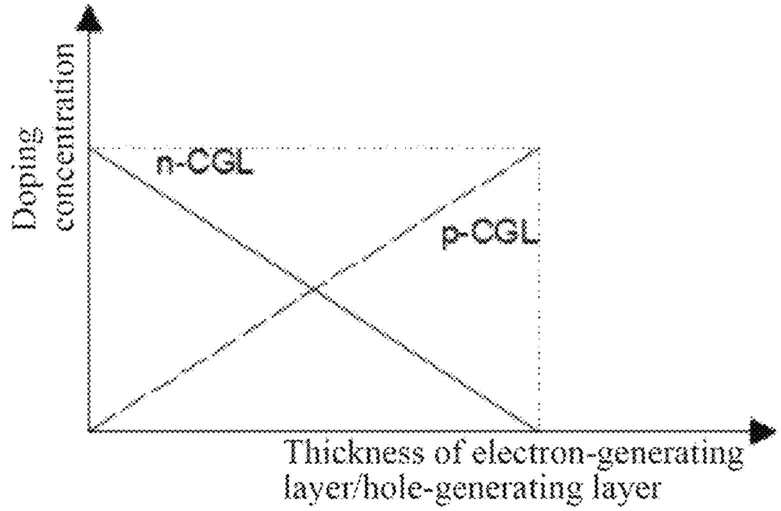
FIG. 3 is schematic diagram of thickness of an electron-generating layer versus concentration distribution of n-type dopants and thickness of an electron-generating layer versus concentration distribution of p-type dopants in a display panel according to embodiments of the present disclosure.

Exemplarily, in this embodiment, the doping concentration of the n-type dopants in the electron-generating layer 20231 changes linearly as the thickness of the electron-generating layer 20231 increases. That is, the doping concentration of the n-type dopants decreases uniformly as the thickness of the electron-generating layer 20231 increases according to a fixed rate of change of doping concentration (FIG. 3). The rate of change can be a constant value, for example, 2 wt %/5 nm. That is, every time the thickness of the electron-generating layer 20231 increases by 5 nm, the doping concentration of the N-type dopants decreases by 2 wt %. The rate of change may also be a non-constant value, which may vary linearly with the thickness of the electron-generating layer 20231 (FIGS. 4 and 5), for example, the rate of change may tend to increase with the increase of the thickness of the electron-generating layer 20231 (FIG. 5), and the rate of change may tend to decrease with the increase of the thickness of the electron-generating layer 20231 (FIG. 4).

Exemplarily, in this embodiment, the doping concentration of the p-type dopants in the hole-generating layer 20232 changes linearly as the thickness of the hole-generating layer 20232 increases (along the first direction F1). That is, the doping concentration of the p-type dopants increases uniformly as the thickness of the hole-generating layer 20232 increases (along the first direction F1) according to a fixed rate of change of doping concentration (FIG. 3). The rate of change can be a constant value, for example, 3 wt %/5 nm. That is, every time the thickness of the hole-generating layer 20232 increases by 5 nm, the doping concentration of the p-type dopants decreases by 3 wt %. The rate of change may also be a non-constant value, which may vary linearly with the thickness of the hole-generating layer 20232 (FIGS. 4 and 5), for example, the rate of change may tend to increase with the increase of the thickness of the hole-generating layer 20232 (FIG. 4), and the rate of change may tend to decrease in the first direction F1 (FIG. 5).

Figure 4:
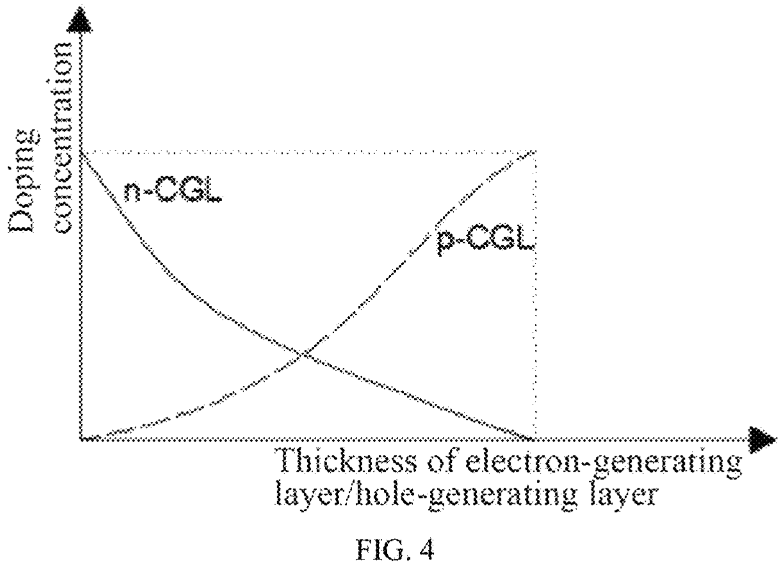
FIG. 4 is a schematic diagram of thickness of an electron-generating layer versus concentration distribution of n-type dopants and thickness of an electron-generating layer versus concentration distribution of p-type dopants in another display panel according to embodiments of the present disclosure.
Figure 5:
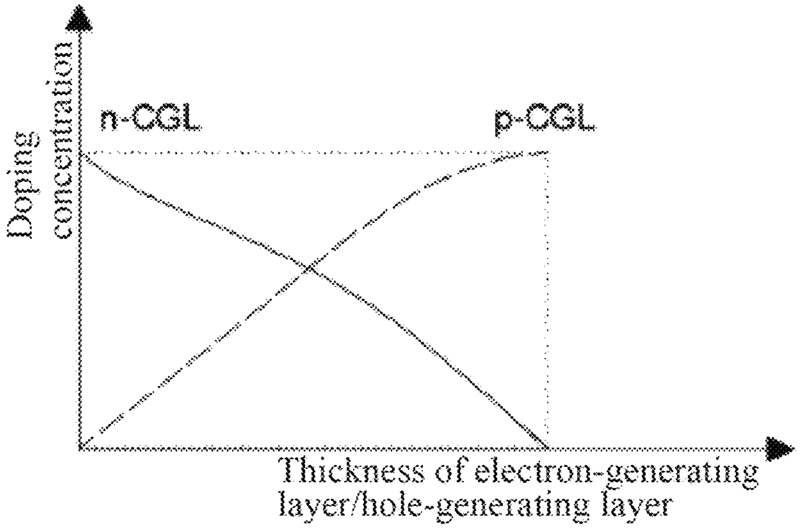
FIG. 5 is a schematic diagram of thickness of an electron-generating layer versus concentration distribution of n-type dopants and thickness of an electron-generating layer versus concentration distribution of p-type dopants in further another display panel according to embodiments of the present disclosure.

Following the above embodiment, as shown in FIG. 4, the rate of change of the doping concentration of the n-type dopants in the electron-generating layer 20231 gradually decreases in the first direction F1.

The rate of change of the doping concentration of the p-type dopants in the hole-generating layer 20232 gradually increases in the first direction F1.

It can be understood that the rate of change of the doping concentration of the n-type dopants in the electron-generating layer 20231 decreases gradually with the increase of the thickness of the electron-generating layer 20231 (in the first direction F1), and at the same time, the rate of change of the doping concentration of the p-type dopants in the hole-generating layer 20232 increases gradually with the increase of the thickness of the hole-generating layer 20232 (in the first direction F1), so that the interface where the electron-generating layer 20231 contacts with the hole-generating layer 20232 has the least interface defects, and the region where the charge is relatively stable is larger, which effectively prevents the occurrence of interface reaction, so that the light-emitting device has a long service life and high driving voltage stability even at a high temperature or a low temperature, which can meet the requirements of using the product in a harsh environment. For specific effects, please refer to the relevant test results of Experimental Example 2 in Experimental Examples.

In one embodiment, the absolute value of the rate of change of the plurality of doping concentrations of the n-type dopants in the electron-generating layer 20231 is the same as the absolute value of the rate of change of the plurality of doping concentrations of the p-type dopants in the hole-generating layer 20232.

Exemplarily, "the absolute value of the rate of change of the plurality of doping concentrations of the n-type dopants in the electron-generating layer 20231" refers to the ratio of the reduced change value of the doping concentration of the n-type dopants in the electron-generating layer 20231 to the thickness of the electron-generating layer 20231.

Exemplarily, "the absolute value of the rate of change of the plurality of doping concentrations of the p-type dopants in the hole-generating layer 20232" refers to the ratio of the change value of the increasing doping concentration of the p-type dopants in the hole-generating layer 20232 to the thickness of the hole-generating layer 20232.

It should be understood that the technical solutions of this embodiment makes the structure of the charge-generating layer 2023 more symmetrical with respect to the interface between the electron-generating layer 20231 and the hole-generating layer 20232, which can effectively ensure the relative balance between charge injection and transport, significantly improve the driving voltage stability of the light-emitting device at high temperatures or low temperatures, prolong the high-temperature service life of the stacked light-emitting device, thus meeting the requirements of products working in harsh environment.

Exemplarily, the electron-generating layer 20231 or the hole-generating layer 20232 with the gradual change of doping concentration can be manufactured by controlling the angle of the line source to limit the angle of the plate, so as to realize the gradual change of doping concentration of the dopants.

In one embodiment, the doping concentration of the n-type dopants ranges from a first concentration to a second concentration, and a difference between the first concentration and the second concentration ranges from 1 wt % to 19 wt %.

The doping concentration of the p-type dopants ranges from a third concentration to a fourth concentration, and a difference between the third concentration and the fourth concentration ranges from 1 wt % to 19 wt %.

Exemplarily, the difference between the first concentration and the second concentration may be any one of 1 wt %, 3 wt %, 5 wt %, 7 wt %, 9 wt %, 11 wt %, 14 wt %, 18 wt %, and 19 wt %, and may be selected according to actual production conditions.

Exemplarily, the difference between the third concentration and the fourth concentration may be any one of 1 wt %, 3 wt %, 5 wt %, 7 wt %, 9 wt %, 11 wt %, 14 wt %, 18 wt %, and 19 wt %, and may be selected according to actual production conditions.

In one embodiment, the first concentration ranges from 6 wt % to 20 wt % and the second concentration ranges from 1 wt % to 5 wt %.

The third concentration ranges from 1 wt % to 5 wt %, and the fourth concentration ranges from 6 wt % to 20 wt %.

Exemplarily, the first concentration may be any one of 6 wt %, 7 wt %, 9 wt %, 11 wt %, 13 wt %, 16 wt %, 18 wt %, and 20 wt %, and may be selected according to actual production conditions.

Specifically, the second concentration may be any one of 1 wt %, 2 wt %, 3 wt %, 4 wt %, and 5 wt %, and may be selected according to actual production conditions.

Exemplarily, the third concentration may be any one of 1 wt %, 2 wt %, 3 wt %, 4 wt %, and 5 wt %, and may be selected according to actual production conditions.

Exemplarily, the fourth concentration may be any one of 6 wt %, 7 wt %, 9 wt %, 11 wt %, 13 wt %, 16 wt %, 18 wt %, and 20 wt %, and may be selected according to actual production conditions.

Figure 7:
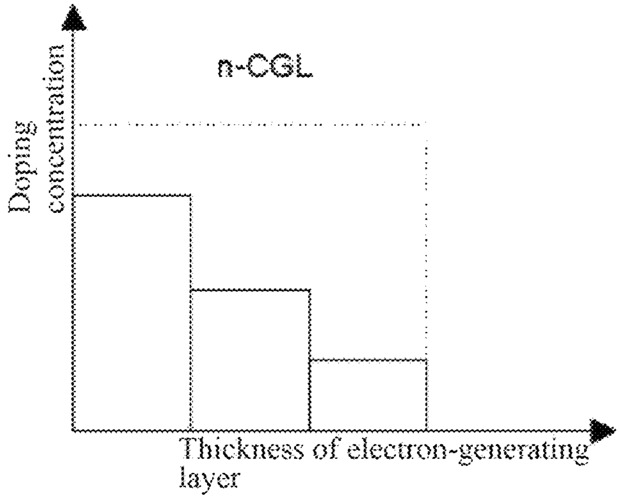
FIG. 7 is a schematic diagram of thickness of an electron-generating layer versus concentration distribution of n-type dopants of in a display panel according to embodiments of the present disclosure.

In one embodiment, as shown in FIG. 7, the electron-generating layer 20231 consists of X layers of electron-generating sub-layers stacked in the first direction F1, a concentration of n-type dopants in a first electron-generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$;

wherein X is a positive integer greater than or equal to 2, and $N_1>N_2>N_3> \ldots >N_{X-1}>N_X$.

Exemplarily, the plurality of electron-generating sub-layers of the electron-generating layer 20231 are stacked without gaps.

Exemplarily, the thickness of each electron-generating sub-layer in the electron-generating layer 20231 may be the same or different, preferably the thickness is the same.

Exemplarily, the concentration of the n-type dopants in the electron-generating sub-layer is equal everywhere, and the value of X may be a positive integer greater than or equal to 2 and less than or equal to 20, preferably the value of X is 3, that is, the electron-generating layer 20231 has three electron-generating sub-layers.

Figure 6:
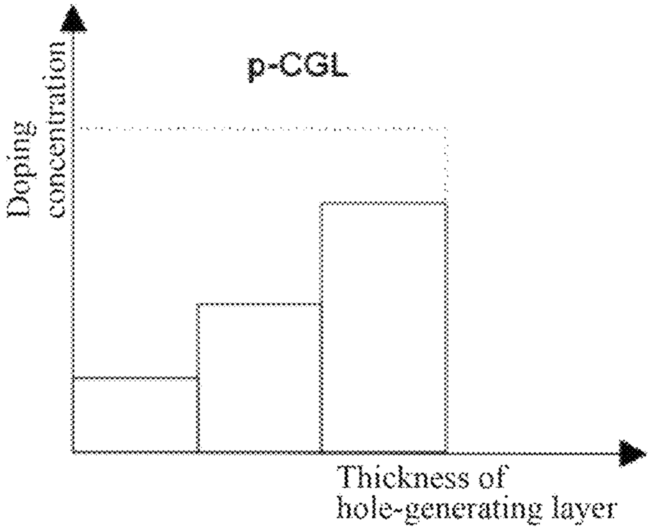
FIG. 6 is a schematic diagram of thickness of a hole-generating layer versus concentration distribution of p-type dopants in a display panel according to embodiments of the present disclosure.

In one embodiment, as shown in FIG. 6, the hole-generating layer 20232 consists of Y layers of hole-generating sub-layers stacked in the first direction F1, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$;

wherein Y is a positive integer greater than or equal to 2, and $M_1<M_2<M_3< \ldots <M_{Y-1}<M_Y$.

Exemplarily, the plurality of hole-generating sub-layers of the hole-generating layer 20232 are stacked without gaps.

Exemplarily, the thickness of each hole-generating sub-layer in the hole-generating layer 20232 may be the same or different, preferably the thickness is the same.

Exemplarily, the concentration of the p-type dopants in the hole-generating sub-layer is equal everywhere, and the Y can be a positive integer greater than or equal to 2 and less than or equal to 20. Preferably, Y is 3, that is, the hole-generating layer 20232 has three hole-generating sub-layers.

Exemplarily, the electron-generating layer 20231 or the hole-generating layer 20232 with change of doping concentration as a concentration gradient can be manufactured by controlling film thickness ratio of the line source, so as to realize the gradient change of dopant doping concentration.

Following the above embodiment, the electron-generating layer 20231 consists of X layers of electron-generating sub-layers stacked in the first direction, a concentration of n-type dopants in a first electron-generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$;

wherein X is a positive integer greater than or equal to 2, and $N_1>N_2>N_3> \ldots >N_{X-1}>N_X$.

The hole-generating layer 20232 consists of Y layers of hole-generating sub-layers stacked in the first direction, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$;

wherein Y is a positive integer greater than or equal to 2, and $M_1<M_2<M_3< \ldots <M_{Y-1}<M_Y$.

Exemplarily, the thickness of each electron-generating sub-layer may be the same or different, and the thickness of each hole-generating sub-layer may be the same or different.

Exemplarily, the difference between $N_X$ and $N_1$ ranges from 1 wt % to 19 wt %, and the difference between $M_Y$ and $M_1$ ranges from 1 wt % to 19 wt %.

Exemplarily, the concentration of the n-type dopants is $N_X$, wherein $N_X$ ranges from 1 wt % to 5 wt %. $N_1$ ranges from 6 wt % to 20 wt %.

Exemplarily, the concentration of the p-type dopants is $M_Y$, wherein $M_Y$ ranges from 6 wt % to 20 wt %. $M_1$ ranges from 1 wt % to 5 wt %.

Further, the values of X and Y may be the same or different.

Further, when the values of X and Y are infinitely large, in this embodiment, the rate of change of the doping concentration of the n-type dopants in the electron-generating layer 20231 may gradually decreases with the increase of the thickness of the electron-generating layer 20231, and the rate of change of the doping concentration of the p-type dopants in the hole-generating layer 20232 may gradually increases with the increase of the thickness of the hole-generating layer 20232. Therefore, in this embodiment, $N_1$ may be the first concentration in the above-mentioned embodiment, $N_X$ may be the second concentration in the above-mentioned embodiment, $M_1$ may be the third concentration in the above-mentioned embodiment, and $M_Y$ may be the fourth concentration in the above-mentioned embodiment.

Figure 9:
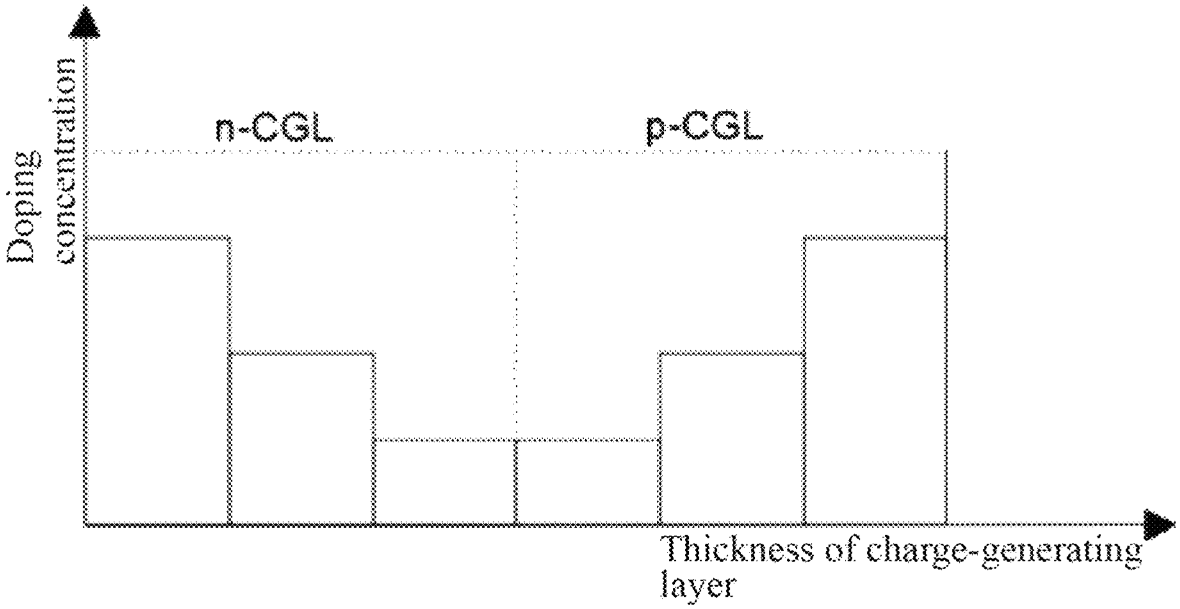
FIG. 9 is a schematic diagram of thickness of s charge-generating layer versus concentration distribution of dopants in another display panel according to embodiments of the present disclosure.

In one embodiment, as shown in FIG. 9, the electron-generating layer 20231 includes a first electron-generating sub-layer, a second electron-generating sub-layer, and a third electron-generating sub-layer stacked in the first direction F1; and the hole-generating layer 20232 includes a first hole-generating sub-layer, a second hole-generating sub-layer, and a third hole-generating sub-layer stacked in the first direction F1.

The concentration of the n-type dopants in the first electron-generating sub-layer is the same as the concentration of the p-type dopants in the third hole-generating sub-layer, the concentration of the n-type dopants in the second electron-generating sub-layer is the same as the concentration of the p-type dopants in the second hole-generating sub-layer, and the concentration of the n-type dopants in the third electron-generating sub-layer is the same as the concentration of the p-type dopants in the first hole-generating sub-layer.

Exemplarily, the thicknesses of the first electron-generating sub-layer, the second electron generating sub-layer, and the third electron generating sub-layer are all equal.

Exemplarily, the thicknesses of the first hole-generating sub-layer, the second hole-generating sub-layer, and the third hole-generating sub-layer are all equal.

Exemplarily, the concentrations of the n-type dopants in the electron-generating layer 20231 and the hole-generating layer 20232 are staggered. That is, the concentration of the n-type dopants in the first electron-generating sub-layer is the same as the concentration of the p-type dopant in the third hole-generating sub-layer, the concentration of the n-type dopants in the second electron-generating sub-layer is the same as the concentration of the p-type dopants in the second hole-generating sub-layer, and the concentration of the n-type dopants in the third electron-generating sub-layer is the same as the concentration of the p-type dopants in the first hole-generating sub-layer. By adopting this technical solution, the structure of the charge-generating layer 2023 is symmetrically disposed, which can effectively ensure the relative balance of charge injection and transport, significantly improve the driving voltage stability of light-emitting devices at a high temperature or a low temperature, prolong the high-temperature service life of stacked light-emitting devices, and meet the requirements of products working in harsh environments. so that the relative balance between charge injection and transport can be effectively ensured, the driving voltage stability of the light-emitting device at a high temperature or a low temperature can be significantly improved, the high-temperature lifetime of the laminated light-emitting device can be improved, and the requirement of the product to work in a harsh environment can be met.

Figure 2B:
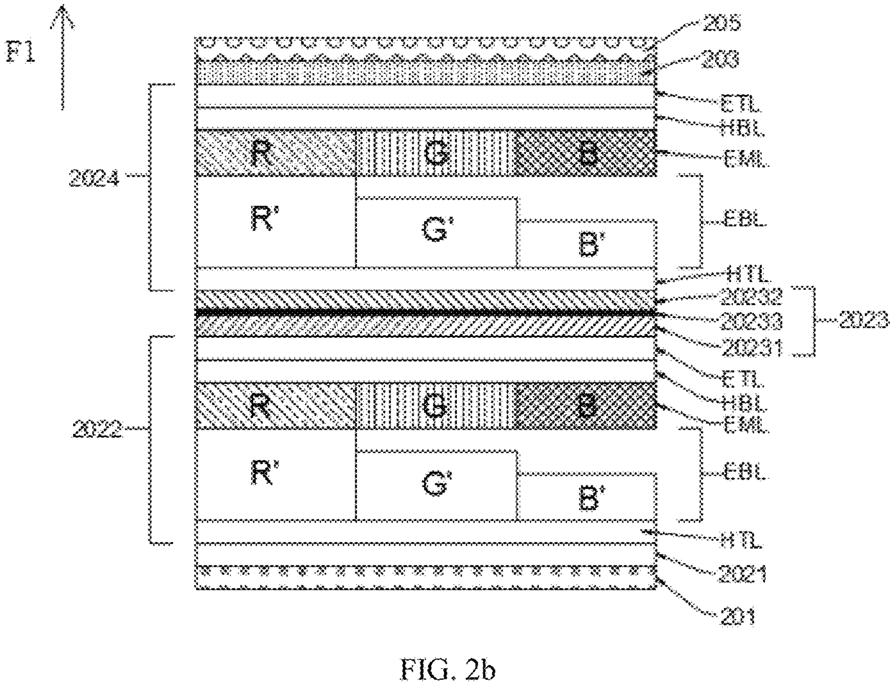
FIG. 2*b* is a schematic structural diagram of another light-emitting device according to embodiments of the present disclosure.
Figure 8:
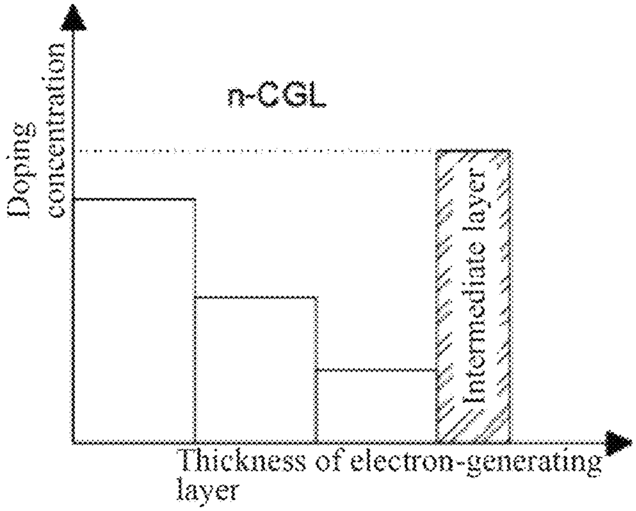
FIG. 8 is a schematic diagram of thickness of an electron-generating layer versus concentration distribution of n-type dopants of in another display panel according to embodiments of the present disclosure.
Figure 10:
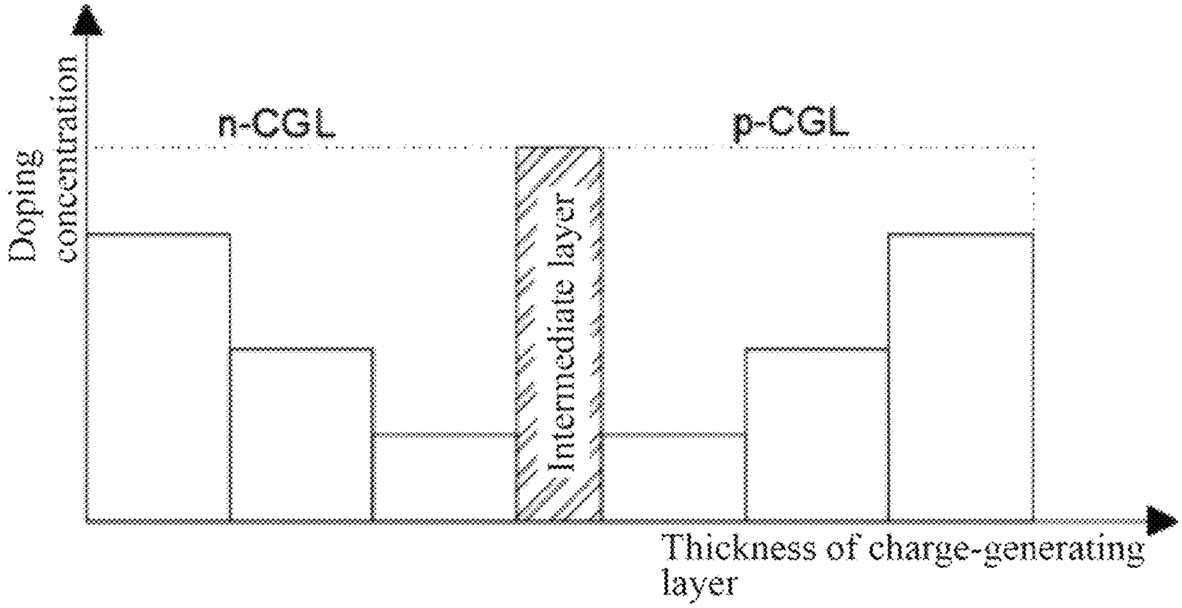
FIG. 10 is a schematic diagram of thickness of a charge-generating layer versus concentration distribution of dopants in another display panel according to embodiments of the present disclosure.

In one embodiment, as shown in FIG. 2*b*, FIG. 8 and FIG. 10, in the light-emitting layer 20, an intermediate layer 20233 is further disposed between the electron-generating layer 20231 and the hole-generating layer 20232, and the material of the intermediate layer 20233 has the property of transporting electrons.

In order to further improve the display brightness of the display panel and further improve the relative balance of charge injection and transport in a high-temperature environment or low-temperature environment, an intermediate layer 20233 is disposed between the electron-generating layer 20231 and the hole-generating layer 20232. The thickness of the intermediate layer 20233 may be range from 0.5 nm to 8 nm, and may be any one of 0.5 nm, 0.8 nm, 1.0 nm, 1.2 nm, 1.4 nm, 2.0 nm, 5.0 nm, and 8.0 nm. The material of the intermediate layer 20233 has the property of transporting electrons.

Exemplarily, the material of the intermediate layer 20233 may include at least one of metal compounds, alkaline metals, and inorganic compounds, such as Li, Al, or the like.

It can be understood that by disposing an intermediate layer 20233 between the electron-generating layer 20231 and the hole-generating layer 20232, the stacked RGB structure can be better connected through the charge-generating layer 2023 and the intermediate layer 20233, which can significantly improve the display brightness of the products, especially improve the relative balance between charge injection and transport at high temperatures or low temperatures, significantly improve the driving voltage stability of light-emitting devices at high temperatures or low temperatures, improve the high temperature service life of stacked light-emitting devices, and meet the requirement of using the product in a harsh environment.

To further illustrate the effects of the embodiments of the present disclosure, the display panels of comparative examples and experimental examples 1-8 were prepared as test samples, and the relevant electrical and optical parameters (including the operating voltage, luminous flux per unit area, external quantum efficiency, and service life of the light-emitting device in the display panel at 25° C., 80° C., and −20° C., respectively under the same conditions) of each sample were tested under the same conditions. The specific sample preparation methods, test conditions and test results are shown in Table 1 (taking the percentage values relative to comparative example 1).

Comparative Example

As shown in FIGS. 1 and 2*a*, a light-emitting layer 20 is formed on an array substrate, and the structure of the light-emitting layer 20 in the first direction F1 is as follows:

Anode (80 nm)/p-HIL (80 nm)/HITL (80 nm)/B'-EBL (30 nm), EBL (30 nm), R'-EBL (60 nm), R-EML (30 nm), G'-EBL (80 nm), G-EML (30 nm)/HBL (5 nm)/ETL (30 nm)/n-CGL (15 nm)/p-CGL (15 nm)/HTL (80 nm)/B'-EBL (30 nm), B-EML (30 nm), R'-EBL (60 nm), R-EML (30 nm), G'-EBL (80 nm), G-EML (30 nm)/HBL (5 nm)/ETL (30 nm)/cathode (80 nm)/CPL (50 nm).

Each of the above film layers can be manufactured by vacuum evaporation or sputtering.

The anode is a ITO/Ag/ITO film.

P-HIL is a p-doped hole injection layer, which is a m-MTDATA:$F_4$TCNQ film.

HITL is a hole injection transport layer, which is HAT-CN film and NPB film.

B'-EBL is an electron-blocking layer corresponding to a blue organic light-emitting layer, which is a NPB:$CS_2CO_3$ film.

B-EML blue organic light-emitting layer is a FIrpic film.

R'-EBL is an electron-blocking layer corresponding to a red organic light-emitting layer, which is a NPB:$CS_2CO_3$ film;

R-EML red organic light-emitting layer is an $Alq_3$:DCJTB film.

G'-EBL is an electron-blocking layer corresponding to a green organic light-emitting layer, which is a NPB:$CS_2CO_3$ film.

G-EML green organic light-emitting layer is an $Alq_3$ film.

Hole-blocking layer HBL is a TAZ film.

Electron transport layer ETL is a $Bepp_2$:$KBH_4$ film.

Electron-generating layer n-CGL is a uniformly doped $Bebq_2$:K film with a doping ratio of 5 wt %.

Hole-generating layer p-CGL is a uniformly doped NPB: $F_4$TCNQ film with a doping ratio of 5 wt %.

Cathode is Ag film.

CPL light extraction layer 205 is an optical resin doped with titanium oxide with a doping ratio of 10%.

EXPERIMENTAL EXAMPLES

Experimental Example 1

The structure is the same as that of the Comparative Example, as shown in FIG. 3, the difference lies in that:

The electron-generating layer n-CGL is a $Bebq_2$:K film with a uniform variable concentration doping and a doping ratio ranging from 7 wt % to 1 wt %.

The hole-generating layer p-CGL is a NPB:$F_4$TCNQ film with a uniform variable concentration doping and a doping ratio ranging from 1 wt % to 7 wt %.

Experimental Example 2

The structure is the same as that of the Comparative Example, as shown in FIG. 4, the difference lies in that:

The electron-generating layer n-CGL is a $Bebq_2$:K film with non-uniform variable concentration doping and a doping ratio ranging from 7 wt % to 1 wt %, wherein the rate of change of the doping concentration of the n-type dopants in the electron-generating layer gradually decreases with the increase of the thickness of the electron-generating layer.

The hole-generating layer p-CGL is a NPB:$F_4$TCNQ film with non-uniform variable concentration doping and a doping ratio ranging from 1 wt % to 7 wt %, and the rate of change of the doping concentration of the p-type dopants in the hole-generating layer gradually increases with the increase of the thickness of the hole-generating layer.

Experimental Example 3

The structure is the same as that of the Comparative Example, as shown in FIG. 5, the difference lies in that:

The electron-generating layer n-CGL is a $Bebq_2$:K film with non-uniform variable concentration doping and a doping ratio ranging from 7 wt % to 1 wt %, wherein the rate of change of the doping concentration of the n-type dopants in the electron-generating layer gradually increases with the increase of the thickness of the electron-generating layer.

The hole-generating layer is a NPB:$F_4$TCNQ film with non-uniform variable concentration doping and a doping ratio ranging from 1 wt % to 7 wt %, wherein the rate of change of the doping concentration of the p-type dopants in the hole-generating layer gradually decreases with the increase of the thickness of the hole-generating layer.

Experimental Example 4

The structure is the same as that of the Comparative Example, as shown in FIG. 6, the difference lies in that:

The hole-generating layer p-CGL is a NPB:$F_4$TCNQ film with gradient concentration doping and a doping ratio ranging from 1 wt % to 7 wt %. It has three concentration gradients, which are 1 wt %, 4 wt % and 7 wt %, respectively. The thickness of each hole-generating sub-layer is 5 nm.

Experimental Example 5

The structure is the same as that of the Comparative Example, as shown in FIG. 7, the difference lies in that:

The electron-generating layer n-CGL is a $Bebq_2$:K film with gradient concentration doping and a doping ratio ranging from 7 wt % to 1 wt %. It has three concentration gradients, which are 7 wt %, 4 wt % and 1 wt %, respectively. The thickness of each electron-generating sub-layer is 5 nm.

Experimental Example 6

The structure is the same as that of the Comparative Example, as shown in FIGS. 8 and 2*b*, the difference lies in that:

The electron-generating layer n-CGL is a $Bebq_2$:K film with gradient concentration doping and a doping ratio ranging from 7 wt % to 1 wt %. It has three concentration gradients, which are 7 wt %, 4 wt % and 1 wt %, respectively. The thickness of each electron-generating sub-layer is 5 nm.

An intermediate layer is disposed between the electron-generating layer n-CGL and the hole-generating layer p-CGL. The material of the intermediate layer is Al, and the thickness of the intermediate layer is 1 nm.

Experimental Example 7

The structure is the same as that of the Comparative Example, as shown in FIGS. 9 and 2*b*, the difference lies in that:

The electron-generating layer n-CGL is a $Bebq_2$:K film with gradient concentration doping and a doping ratio ranging from 7 wt % to 1 wt %. It has three concentration gradients, which are 7 wt %, 4 wt % and 1 wt %, respectively. The thickness of each electron-generating sub-layer is 5 nm.

The hole-generating layer p-CGL is a NPB:$F_4$TCNQ film with gradient concentration doping and a doping ratio ranging from 1 wt % to 7 wt %. It has three concentration gradients, which are 1 wt %, 4 wt % and 7 wt %, respectively. The thickness of each hole-generating sub-layer is 5 nm.

Experimental Example 8

The structure thereof is the same as that of the Comparative Example, as shown in FIG. 10, the difference lies in that:

The electron-generating layer n-CGL is a $Bebq_2$:K film with gradient concentration doping and a doping ratio ranging from 7 wt % to 1 wt %. It has three concentration gradients, which are 7 wt %, 4 wt % and 1 wt %, respectively. The thickness of each electron-generating sub-layer is 5 nm.

The hole-generating layer p-CGL is a NPB:$F_4$TCNQ film with gradient concentration doping and a doping ratio ranging from 1 wt % to 7 wt %. It has three concentration gradients, which are 1 wt %, 4 wt %, and 7 wt %, respectively. The thickness of each hole-generating sub-layer is 5 nm.

An intermediate layer is disposed between the electron-generating layer n-CGL and the hole-generating layer p-CGL. The material of the intermediate layer is Al and the thickness of the intermediate layer is 1 nm.

The specific structures are shown in Table 1 below.

TABLE 1

| Items | Vop (V) | C.E. (Cd/A) | EQE | Service life (hrs) @25° C. | Service life (hrs) @80° C. | Service life (hrs) @−20° C. |
|---|---|---|---|---|---|---|
| Comparative Example | 100% | 100% | 100% | 100% | 100% | 100% |
| Experimental Example 1 | 95% | 120% | 123% | 110% | 105% | 106% |
| Experimental Example 2 | 95% | 121% | 124% | 110% | 106% | 104% |
| Experimental Example 3 | 96% | 115% | 119% | 106% | 107% | 107% |
| Experimental Example 4 | 97% | 102% | 101% | 100% | 100% | 100% |
| Experimental Example 5 | 95% | 103% | 102% | 100% | 100% | 100% |
| Experimental Example 6 | 93% | 103% | 102% | 110% | 112% | 109% |
| Experimental Example 7 | 94% | 125% | 125% | 115% | 116% | 117% |
| Experimental Example 8 | 93% | 125% | 125% | 120% | 118% | 122% |

By comparing Comparative Example and Experimental Examples 1 to 8, it can be seen that in the first direction F1, the n-type dopants at different thicknesses in the electron-generating layer 20231 of the light-emitting layer 20 has a plurality of doping concentrations, and the doping concentration of the n-type dopants tends to decrease with the increase of the thickness of the electron-generating layer 20231, and/or the p-type dopants at different thicknesses in the hole-generating layer 20232 have a plurality of doping concentrations, and the doping concentration of the p-type dopants tends to increase with the increase of the thickness of the hole-generating layer 20232, so that the current efficiency and the service life of the light-emitting device of the OLED display panel in high or low temperature environments can be improved and meanwhile the driving voltage (operating voltage) can be reduced.

By comparing Experimental Example 1, Experimental Example 2 and Experimental Example 3, it can be seen that the rate of change of the doping concentration of the n-type dopants in the electron-generating layer 20231 decreases gradually with the increase of the thickness of the electron-generating layer 20231, and the rate of change of the doping concentration of the p-type dopants in the hole-generating layer 20232 increases gradually with the increase of the thickness of the hole-generating layer 20232, so that the interface where the electron-generating layer 20231 contacts with the hole-generating layer 20232 has the least interface defects, and the region where the charge is relatively stable is larger, which effectively prevents the occurrence of interface reaction, so that the light-emitting device has a long service life and high driving voltage stability even at a high temperature or a low temperature, which can meet the requirements of using the product in a harsh environment.

By comparing Comparative Example 2 and Experimental Example 7, it can be seen that in case that the doping concentration of the n-type dopants in the electron-generating layer 20231 and the doping concentration of the p-type dopants in the hole-generating layer 20232 are gradient changed, so that the corresponding light-emitting device has a longer service life, a lower driving voltage value, a higher luminous flux per unit area, and a higher external quantum efficiency than the case that the linearly changing doping concentration is used.

By comparing Experimental Example 4, Experimental Example 5 and Experimental Example 7, it can be seen that in a case that both the doping concentration of the n-type dopants in the electron-generating layer 20231 and the doping concentration of the p-type dopants in the hole-generating layer 20232 change, the corresponding light-emitting device has a longer service life, a lower driving voltage value, a higher luminous flux per unit area, and a higher external quantum efficiency than the case that either the doping concentration of the n-type dopants in the electron-generating layer 20231 changes or the doping concentration of the p-type dopants in the hole-generating layer 20232 changes.

By comparing Experimental Example 5 and Experimental Example 6, or by comparing Experimental Example 7 and Experimental Example 8, it can be seen that although the additional intermediate layer 20233 cannot improve the luminous flux per unit area and the external quantum efficiency of the light-emitting device, it can effectively reduce the operating voltage and prolong the service life of the light-emitting device in a harsh environment.

The present disclosure also provides a mobile terminal including a display panel using any of the above embodiments.

Exemplarily, mobile terminals include, but are not limited to, the following types: rollable or foldable mobile phones, watches, wristbands, TVs or other wearable display or touch electronics, as well as flexible smartphones, tablets, laptops, desktop displays, televisions, smart glasses, smart watches, ATM machines, digital cameras, on-board displays, medical displays, industrial displays, electronic paper books, electrophoretic display devices, game consoles, transparent displays, double-sided displays, naked-eye 3D displays, mirror display devices, semi-reflective semi-transmissive display devices, and the like.

In view of the above, although the present disclosure has been disclosed in preferred embodiments above, the above preferred embodiments are not intended to limit the present disclosure. Those skilled in the art may make various changes and modifications without departing from the spirit and scope of the present disclosure. Therefore, the scope of protection of the present disclosure shall be subject to the scope defined in the claims.

What is claimed is:

1. A display panel, comprising:

a substrate layer; and a light-emitting layer comprising a first electrode, a hole injection layer, a first light-emitting unit layer, an electron-generating layer, a hole-generating layer, a second light-emitting unit layer, and a second electrode stacked in sequence, the first electrode being disposed on the substrate layer, the electron-generating layer comprising n-type dopants, and the hole-generating layer comprising p-type dopants;

wherein a first direction is perpendicular to the substrate layer and extends from the substrate layer to the light-emitting layer, and in the first direction, the n-type dopants in the electron-generating layer has a plurality of doping concentrations, and the plurality of doping concentrations of the n-type dopants in the electron-generating layer tend to decrease in the first direction; and/or the p-type dopants in the hole-generating layer has a plurality of doping concentrations, and the plurality of doping concentrations of the p-type dopants in the hole-generating layer tend to increase in the first direction; and wherein the first light-emitting unit layer comprises an organic light-emitting layer, the organic light-emitting layer comprises a red light-emitting layer, a green light-emitting layer, and a blue light-emitting layer that are disposed side by side, a thickness of the red light-emitting layer is greater than a thickness of the green light-emitting layer, and the thickness of the green light-emitting layer is greater than a thickness of the blue light-emitting layer.

2. The display panel according to claim 1, wherein in a case that the plurality of doping concentrations of the n-type dopants in the electron-generating layer tend to decrease in the first direction, the plurality of doping concentrations of the n-type dopants in the electron-generating layer gradually decrease in the first direction; and in a case that the plurality of doping concentrations of the p-type dopants in the hole-generating layer tend to increase in the first direction, the plurality of doping concentrations of the p-type dopants in the hole-generating layer gradually increase in the first direction.

3. The display panel according to claim 2, wherein a rate of change of the plurality of doping concentrations of the n-type dopants in the electron-generating layer gradually decrease in the first direction; and a rate of change of the plurality of doping concentrations of the p-type dopants in the hole-generating layer gradually increase in the first direction.

4. The display panel according to claim 2, wherein an absolute value of the rate of change of the plurality of doping concentrations of the n-type dopants in the electron-generating layer is the same as an absolute value of the rate of change of the plurality of doping concentrations of the p-type dopants in the hole-generating layer.

5. The display panel according to claim 2, wherein each of the plurality of doping concentrations of the n-type dopants ranges from a first concentration to a second concentration, and a difference between the first concentration and the second concentration ranges from 1 wt % to 19 wt %; and each of the plurality of doping concentrations of the p-type dopants ranges from a third concentration to a fourth concentration, and a difference between the third concentration and the fourth concentration ranges from 1 wt % to 19 wt %.

6. The display panel according to claim 5, wherein the first concentration ranges from 6 wt % to 20 wt %, and the second concentration ranges from 1 wt % to 5 wt %; and the third concentration ranges from 1 wt % to 5 wt %, and the fourth concentration ranges from 6 wt % to 20 wt %.

7. The display panel according to claim 1, wherein the electron-generating layer consists of X layers of electron-generating sub-layers stacked in the first direction, a concentration of n-type dopants in a first electron-generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$; and wherein X is a positive integer greater than or equal to 2, and $N_1>N_2>N_3> \ldots >N_{X-1}>N_X$.

8. The display panel according to claim 7, wherein the hole-generating layer consists of Y layers of hole-generating sub-layers stacked in the first direction, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$; and wherein Y is a positive integer greater than or equal to 2, and $M_1<M_2<M_3< \ldots <M_{Y-1}<M_Y$.

9. The display panel according to claim 8, wherein the electron-generating layer comprises a first electron-generating sub-layer, a second electron-generating sub-layer, and a third electron-generating sub-layer stacked in the first direction, and the hole-generating layer comprises a first hole-generating sub-layer, a second hole generating sub-layer, and a third hole-generating sub-layer stacked in the first direction; and wherein a concentration of n-type dopants in the first electron-generating sub-layer is the same as a concentration of p-type dopants in the third hole-generating sub-layer, a concentration of n-type dopants in the second electron-generating sub-layer is the same as a concentration of p-type dopants in the second hole-generating sub-layer, and a concentration of n-type dopants in the third electron-generating sub-layer is the same as a concentration of p-type dopants in the first hole-generating sub-layer.

10. The display panel according to claim 1, wherein in the light-emitting layer, an intermediate layer is disposed between the electron-generating layer and the hole-generating layer, and a material of the intermediate layer has a property of transporting electrons.

11. The display panel according to claim 10, wherein the material of the intermediate layer comprises at least one of metal compounds, alkaline metals, and inorganic compounds.

12. A mobile terminal comprising a display panel, wherein the display panel comprises:

a substrate layer;

a light-emitting layer comprising a first electrode, a hole injection layer, a first light-emitting unit layer, an electron-generating layer, a hole-generating layer, a second light-emitting unit layer, and a second electrode stacked in sequence, the first electrode is disposed on the substrate layer, the electron-generating layer comprises n-type dopants, and the hole-generating layer comprises p-type dopants;

wherein a first direction is perpendicular to the substrate layer and extends from the substrate layer to the light-emitting layer, and in the first direction, the n-type dopants in the electron-generating layer has a plurality of doping concentrations, and the plurality of doping concentrations of the n-type dopants in the electron-generating layer tend to decrease in the first direction; and/or the p-type dopants in the hole-generating layer has a plurality of doping concentrations, and the plurality of doping concentrations of the p-type dopants in the hole-generating layer tend to increase in the first direction; and wherein the first light-emitting unit layer comprises an organic light-emitting layer, the organic light-emitting layer comprises a red light-emitting layer, a green light-emitting layer, and a blue light-emitting layer that are disposed side by side, a thickness of the red light-emitting layer is greater than a thickness of the green light-emitting layer, and the thickness of the green light-emitting layer is greater than a thickness of the blue light-emitting layer.

13. The mobile terminal according to claim 12, wherein in a case that the plurality of doping concentrations of the n-type dopants in the electron-generating layer tend to decrease in the first direction, the plurality of doping concentrations of the n-type dopants in the electron-generating layer gradually decrease in the first direction; and in a case that the plurality of doping concentrations of the p-type dopants in the hole-generating layer tend to increase in the first direction, the plurality of doping concentrations of the p-type dopants in the hole-generating layer gradually increase in the first direction.

14. The mobile terminal according to claim 13, wherein a rate of change of the plurality of doping concentrations of the n-type dopants in the electron-generating layer gradually decrease in the first direction; and a rate of change of the plurality of doping concentrations of the p-type dopants in the hole-generating layer gradually increase in the first direction.

15. The mobile terminal according to claim 13, wherein an absolute value of the rate of change of the plurality of doping concentrations of the n-type dopants in the electron-generating layer is the same as an absolute value of the rate of change of the plurality of doping concentrations of the p-type dopants in the hole-generating layer.

16. The mobile terminal according to claim 13, wherein each of the plurality of doping concentrations of the n-type dopants ranges from a first concentration to a second concentration, and a difference between the first concentration and the second concentration ranges from 1 wt % to 19 wt %; and each of the plurality of doping concentrations of the p-type dopants ranges from a third concentration to a fourth concentration, and a difference between the third concentration and the fourth concentration ranges from 1 wt % to 19 wt %.

17. The mobile terminal according to claim 16, wherein the first concentration ranges from 6 wt % to 20 wt %, and the second concentration ranges from 1 wt % to 5 wt %; and the third concentration ranges from 1 wt % to 5 wt %, and the fourth concentration ranges from 6 wt % to 20 wt %.

18. The mobile terminal according to claim 12, wherein the electron-generating layer consists of X layers of electron-generating sub-layers stacked in the first direction, a concentration of n-type dopants in a first electron-generating sub-layer is $N_1$, a concentration of n-type dopants in a second electron-generating sub-layer is $N_2$, and a concentration of n-type dopants in a third electron-generating sub-layer is $N_3$, . . . , and a concentration of n-type dopants in a X-th electron-generating sub-layer is $N_X$; and wherein X is a positive integer greater than or equal to 2, and $N_1>N_2>N_3> \ldots >N_{X-1}>N_X$.

19. The mobile terminal according to claim 18, wherein the hole-generating layer consists of Y layers of hole-generating sub-layers stacked in the first direction, a concentration of p-type dopants in a first hole-generating sub-layer is $M_1$, a concentration of p-type dopants in a second hole-generating sub-layer is $M_2$, a concentration of p-type dopants in a third hole-generating sub-layer is $M_3$, and a concentration of p-type dopants in the hole-generating sub-layer of a Yth layer is $M_Y$; and wherein Y is a positive integer greater than or equal to 2, and $M_1<M_2<M_3< \ldots <M_{Y-1}<M_Y$.

20. The mobile terminal according to claim 19, wherein the electron-generating layer comprises a first electron-generating sub-layer, a second electron-generating sub-layer, and a third electron-generating sub-layer stacked in the first direction, and the hole-generating layer comprises a first hole-generating sub-layer, a second hole-generating sub-layer, and a third hole-generating sub-layer stacked in the first direction; and wherein a concentration of n-type dopants in the first electron-generating sub-layer is the same as a concentration of p-type dopants in the third hole-generating sub-layer, a concentration of n-type dopants in the second electron-generating sub-layer is the same as a concentration of p-type dopants in the second hole-generating sub-layer, and a concentration of n-type dopants in the third electron-generating sub-layer is the same as a concentration of p-type dopants in the first hole-generating sub-layer.

* * * * *